United States Patent [19]
Carlstedt

[11] Patent Number: 5,404,270
[45] Date of Patent: Apr. 4, 1995

[54] HOUSING FOR ELECTRIC CIRCUITRY PACKAGES

[75] Inventor: L. Gunnar Carlstedt, Partille, Sweden

[73] Assignee: Piled Electronics I Partille Aktiebolag, Savedalen, Sweden

[21] Appl. No.: 145,315

[22] Filed: Nov. 3, 1993

Related U.S. Application Data

[63] Continuation of Ser. No. 844,990, Feb. 28, 1992, abandoned.

[30] Foreign Application Priority Data

Mar. 1, 1991 [SE] Sweden .................... 9100596

[51] Int. Cl.⁶ .................................. H05K 7/20
[52] U.S. Cl. ........................... 361/689; 165/46; 165/104.33; 257/714; 257/726; 361/699; 439/485
[58] Field of Search ............... 361/735, 784, 785, 788, 361/790, 796, 689, 699, 704, 705, 718, 719, 722; 257/713, 714, 718, 719, 723, 724, 726; 165/46, 80.3, 80.4, 185, 104.19, 104.33; 439/61, 62, 329, 64, 74, 196, 825, 485, 457; 174/15.1; 62/259.2

[56] References Cited

U.S. PATENT DOCUMENTS

| | | |
|---|---|---|
| 4,019,798 | 4/1977 | Zielinski . |
| 4,116,516 | 9/1978 | Griffin . |
| 4,643,497 | 2/1987 | Oelsch . |
| 4,771,366 | 9/1988 | Blake et al. ............... 361/387 |
| 4,938,279 | 7/1990 | Betker ........................ 165/46 |
| 4,956,746 | 9/1990 | Gates, Jr. et al. ........... 361/385 |
| 4,997,032 | 3/1991 | Danielson et al. .......... 165/46 |
| 5,000,256 | 3/1991 | Tousignant .................. 165/46 |
| 5,006,924 | 4/1991 | Frankeny ................... 165/80.4 |
| 5,007,478 | 4/1991 | Sengupta ................... 165/10 |
| 5,131,859 | 7/1992 | Bowen et al. .............. 439/194 |
| 5,245,508 | 9/1993 | Mizzi ......................... 361/694 |
| 5,270,902 | 12/1993 | Bellar ....................... 361/718 |

FOREIGN PATENT DOCUMENTS

| | | |
|---|---|---|
| 0309279 | 3/1989 | European Pat. Off. . |
| 1433088 | 2/1966 | France . |
| 2320202 | 11/1974 | Germany . |
| 3021024 | 12/1980 | Germany . |
| 3321320 | 7/1989 | Germany . |
| 3-30399 | 2/1991 | Japan . |
| 403896 | 6/1966 | Switzerland . |

(List continued on next page.)

OTHER PUBLICATIONS

"Wafer Voltage Distribution", *IBM Technical Disclosure Bulletin,* vol. 18, No. 6, Nov. 1975, By A. Johnson, p. 1851.

(List continued on next page.)

*Primary Examiner*—Gerald P. Tolin
*Attorney, Agent, or Firm*—Young & Thompson

[57] ABSTRACT

A housing for accommodation of a plurality of electric circuitry packages, a method for assembling the housing, a cooling arrangement, and an electrical connection arrangement are disclosed. The housing can accommodate a plurality of packages, supply the packages with power, connect them electrically, support them and cool them. By means of the resilient support, the housing can withstand and protect the packages from shocks and vibrations. By means of the resilient connection, the housing can handle package size differences, e.g. due to thermal expansion caused by temperature changes. The cooling arrangement for cooling the electric circuitry packages includes several cooling units sandwiched with the packages into a stack. A cooling fluid cools the packages by flowing through each cooling unit. The units have flexible package facing walls, which form themselves to the package surfaces due to the cooling fluid pressure. The electrical connection arrangement includes several connector and wire assemblies for electrical connection of a plurality of electric circuitry packages, each assembly including one or more flat cables including data wires, several connector assemblies establishing electrical contact between the data wires and the packages, and one or more power wires connected to and supplying power to the packages.

55 Claims, 9 Drawing Sheets

FOREIGN PATENT DOCUMENTS

| | | |
|---|---|---|
| 422937 | 4/1967 | Switzerland . |
| 528827 | 11/1972 | Switzerland . |
| 1231268 | 5/1971 | United Kingdom . |
| 1295138 | 11/1972 | United Kingdom . |
| WO80/01628 | 8/1980 | WIPO . |

OTHER PUBLICATIONS

"Crosshatched Reference Plane", *IBM Technical Disclosure Bulletin*, vol. 20, No. 6, Nov. 1977, By G. Crowder et al., pp. 2225–2226.

"Wirability Enhancement", *IBM Technical Disclosure Bulletin*, vol. 21, No. 9, Feb. 1979, By R. Jarvela et al., p. 3624.

"Stack Assembly of Printed Circuit Cards", *IBM Technical Disclosure Bulletin*, vol. 23, No. 12, May 1981, By M. Kubota, pp. 5435–5436.

"Low-Cost Multilayer Substrate Packaging", *IBM Technical Disclosure Bulletin*, vol. 25, No. 12, May 1983, By G. Anderson, p. 6464.

"Rotatable Power Assembly (Self-Contained Unit)", *IBM Technical Disclosure Bulletin*, vol. 28, No. 12, May 1986, pp. 5597–5598.

HOUSING FOR ELECTRIC CIRCUITRY PACKAGES

This application is a continuation of application Ser. No. 07/844,990, filed Feb. 28, 1992, now abandoned.

FIELD OF THE INVENTION

This invention is directed to a housing for the accomodation of packages, where each package includes electric circuitry, e.g. a VLSi-chip. The VLSI-chip could be wafer sized.

BACKGROUND OF THE INVENTION

In most housings for accomodation of electronics four basic aspects have to be considered, namely how to supply power to the electronics, how to connect the electronics electrically, how to support the electronics mechanically and how to cool the electronics.

Supply of Power

Traditionally power has been supplied by either integrating a power supply in the housing, thereby providing power by internal connectors and/or wires, or by providing an external power supply from which power can be supplied, via external wires and terminals of the housing, to the electronics through internal wires and possibly internal connectors. A problem with these techniques has been reliability. If an external power supply is used for a whole system, which could include several housings, a failure of the power supply could disable the operation of the complete system. Similarly, a failing internal power supply could lead to a complete loss of power in the housing. One solution to the problem has been to duplicate power supplies, i.e. one power supply is used as a back-up and the other is in operation supplying power. A considerable drawback with this solution is that the cost of providing power is doubled, both in hardware and actual cost. Another drawback is that, even though the probability for total loss of power has been reduced, both supplies could fail.

Electrical Connection

In order to electrically connect the electronics, contact has to be established between the electronics and some kind of wiring for data and power signal transfer. Traditionally, electrical connection of the electronics has been provided by rigid, fixed connections, both within the housing accomodating the electronics, i.e. internally, and to the outside, i.e. externally. Fixed connections used include soldered connections, different arrangements including one or more contacts with plugs which fits into corresponding sockets and so forth. A drawback with these fixed connections is their inability to handle thermal expansion, severe vibrations, shocks and differences in tolerances. Different materials have different thermic expansions, which in a stiff, fixed connection can lead to cracks and/or failures due to fatigue, thereby shortening the expected lifetime. Vibrations, shocks and tolerance differences can lead to similar problems.

Another aspect which has to be considered is how to establish contact in a multitude of points in an easy, reliable and cost-effective way. This aspect is specially important when contacting complex electronics which have a multitude of inputs and outputs which are to be contacted.

Cooling

Traditionally, cooling has been provided in a variety of ways of which a few will be described below. When it comes to cooling techniques utilizing a cooling fluid, the main aspect to consider regarding cooling of the electronics is how to obtain a good thermal path from the electronics to a cooling fluid, which can be provided by some kind of cooling device. The cooling fluid could be a liquid or a gas, e.g. air. One way to provide cooling, often used for cooling computer electronics, is to integrate a fan into an outer housing of the computer or outside the computer, which fan provides a flow of air through the electronics. The air can be cooled or just be of normal room temperature. This technique has a limited cooling capacity and is inadequate for cooling electronics with a very high component density, which is the case for highly integrated circuits where the total signal path length has been optimized for performance. This led to other cooling techniques using liquid as cooling fluid, e.g. for cooling supercomputers. Different schemes have been adopted by different manufacturers, e.g.:

a). using metal conductors as thermal paths from the chips to some kind of container with cooling liquid.

b) using rigid containers, e.g. metal pistons (IBM) or pipes, which can be brought in contact with the chips, whereby the thermal path extends from a chip, through the walls of the rigid container, to the cooling liquid.

c) providing microchannels in the substrate on which the chip is mounted, the cooling liquid being pressed through the channels. This scheme introduces difficulties in avoiding the conductors buried in the substrate, as well as additional hardware increasing complexity, None of the above methods can assure good thermal contact between the cooling liquid and every point on the surface of the chip and/or the substrate.

Another cooling technique which has been used includes spraying the surface of the chip with a liquid, which evaporates when striking the surface.

Yet another cooling technique which has been adopted for cooling certain supercomputers involves sinking the whole device including the electronics into a cooling liquid. The device has to be drained before access of a part of the device. In addition the liquid used has to fulfill stringent requirements.

OBJECTS OF THE INVENTION

The object of the invention is to provide a housing for accomodation of a plurality of packages, e.g. including wafer sized VLSI-chips, where the packages are power supplied, electrically connected, mechanically supported, and cooled. The housing should withstand and protect the packages from severe environmental conditions, such as shocks, vibrations, e.g. 30 G, a wide range of temperatures, e.g. $-55°$ to $+40°$ C., with related thermal expansions, and high altitudes, e.g. 20 km. The housing should also include few parts, be suitable for mass production, have a low price, and allow for wide manufacturing tolerances.

Another object of the invention is to provide a cooling technique, which provides effective cooling of the packages.

Still another object of the invention is to provide flexible electrical connection of the packages.

SUMMARY OF THE INVENTION

The main object of the invention is achieved by a housing for accomodation of a plurality of electric circuitry packages, the housing including:
a) resilient supporting means, which supports the packages mechanically, including a rigid cage assembly formed by two end frames connected to each other by means of a plurality of support rods,
b) a plurality of resilient units sandwiched with the packages into a stack, which is mounted in the cage assembly and in which a unit is provided both above and below each package,
c) connection means for electrically connecting the packages in the cage assembly as well as resiliently holding them, including a plurality of connector and wire assemblies,
d) power supply means, which supplies the packages with power and which are mounted to the end frames in the cage assembly.

The housing can accomodate a plurality of packages, supply the packages with power, connect them electrically, support them and cool them. By means of the resilient support the housing can withstand and protect the packages from shocks and vibrations. By means of the resilient connection the housing can handle package size differences, e.g. due to thermal expansion caused by temperature changes.

The object of providing a cooling technique is achieved by a cooling arrangement for cooling electric circuitry packages, which includes several cooling units sandwiched with the packages into a stack. A cooling fluid cools the packages by flowing through each cooling unit, via cooling unit inlets and outlets. The units have flexible package facing walls, which form themselves to the package surfaces due to the cooling fluid pressure. The cooling units could be provided as the resilient units in the housing (see b) above).

By means of the flexible walls of the cooling units good thermal conductivity can be obtained. In addition the cooling units provide added resilient support to the packages, when incorprated in a housing.

Each cooling unit includes a cooling unit frame providing rigid walls perpendicular to the flexible package facing walls of the cooling unit. The frame could be provided with projections fitting in corresponding slots provided in the support rods. The height of the projections governing the minimum distance between the packages.

The rigid frame walls provide added support to the packages. In addition the frame direct the expansion of the cooling units toward the packages. The frames also positions the packages by deciding the minimum distance between them.

The cooling unit inlets and outlets are releasably connected to at least one .cooling fluid inlet tube and at least one cooling fluid outlet tube, respectively. The tubes are held in place by the end frames. The tubes transport the cooling fluid between the the cooling units and a cooling fluid source.

The tubes transport the cooling fluid to and from the cooling units in a simple and cost effective manner.

According to one embodiment each cooling unit includes a cooling bag made of a flexible material held in the cooling unit frame.

The object of providing flexible connection of a stack of electric circuitry packages is achieved by a electrical connection arrangement, which includes several connector and wire assemblies, each including one or more flat cables including data wires, several connector assemblies establishing electrical contact between the data wires and the packages, and one or more power wires connected to and supplying power to the packages. The electrical connection arrangement could be provided as the connection means in the housing (see c) above).

The flexible connections allow slight package movement as well as package size differences.

According to one embodiment each connector and wire assembly includes a plurality of resilient connector assemblies mounted to a plurality of backplanes, which are mounted to the support rods, each connector assembly contacting a plurality of wires for data communication and power supply to a plurality of contact points provided on each package. In this embodiment each connector assembly is mounted over a package by means of resilient contact springs. According to another embodiment, each connector assembly is mounted inbetween the packages by means of the resilient contact springs.

The connector assemblies allow a multitude of contact points to be established. Each connector assembly could establish several hundred contact points.

Each flat cable is a film with a plurality of layers with at least one contact pad layer including a plurality of contact pads for establishing contact with a plurality of pads provided on the packages, and at least one data wire layer including a plurality of data wires for data communication.

Power wires could be included in one or more power wire layers provided in the flat cable. As an alternative a separate power bus could be used.

Each connector assembly includes a connector provided with two horizontal rows of contact springs. The electrical contact between the data wires of a flat cable and the data package pads of a package is established by means of at least some of the plurality of contact springs, each pressing a number of flat cable contact pads against a corresponding number of data package pads, putting the points of contact under pressure.

The contact springs provide means for establishing a multitude of contact points. They also allow package thickness differences.

When the power wires are included in a flat cable it is preferable to establish contact between the wires and the power package pads of a package in the same way as contact is established between data wires and data package pads, i.e. by indirect contact by means of the contact springs and a flat cable. When the power wires are provided in a separate power bus it is to preferable to establish direct contact, i.e. the contact springs in direct contact with the power wires and the power package pads of a package.

BRIEF DESCRIPTION OF THE DRAWINGS

For a more complete understanding of the present invention and for further objects and advantages thereof, reference is now made to the following description taken in conjunction with the accompanying drawings, in which.

DESCRIPTION OF THE PREFERRED EMBODIMENTS

Figure 1:
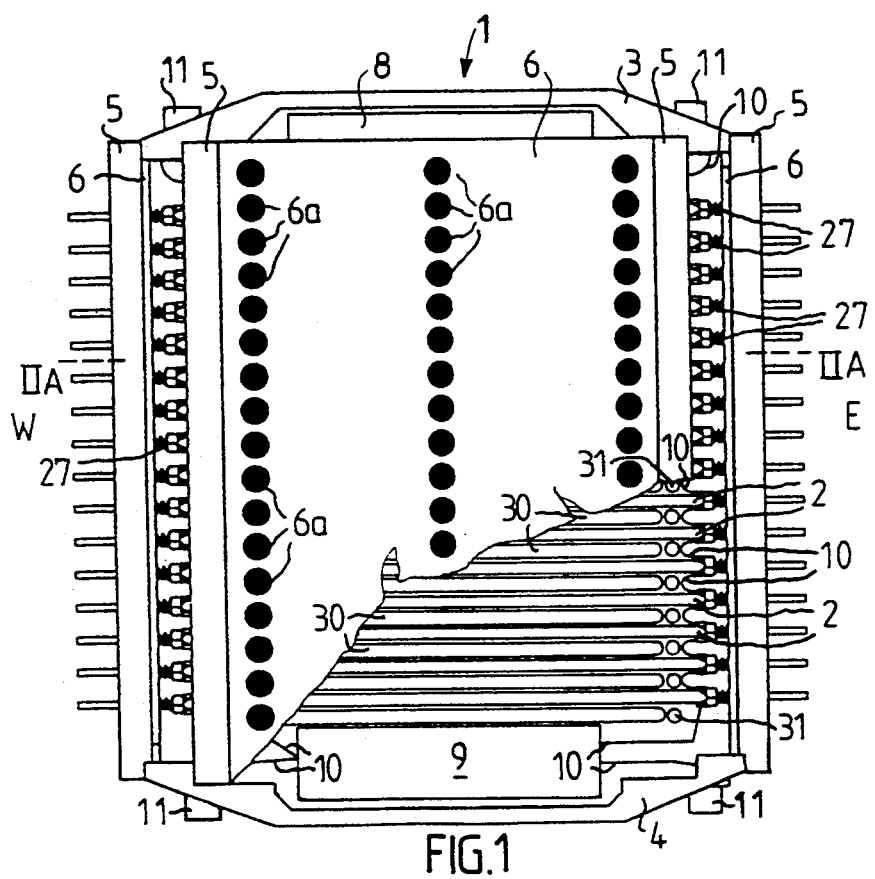
FIG. 1 shows, from one side, schematically the structure of a housing according to the invention.
Figure 2A:
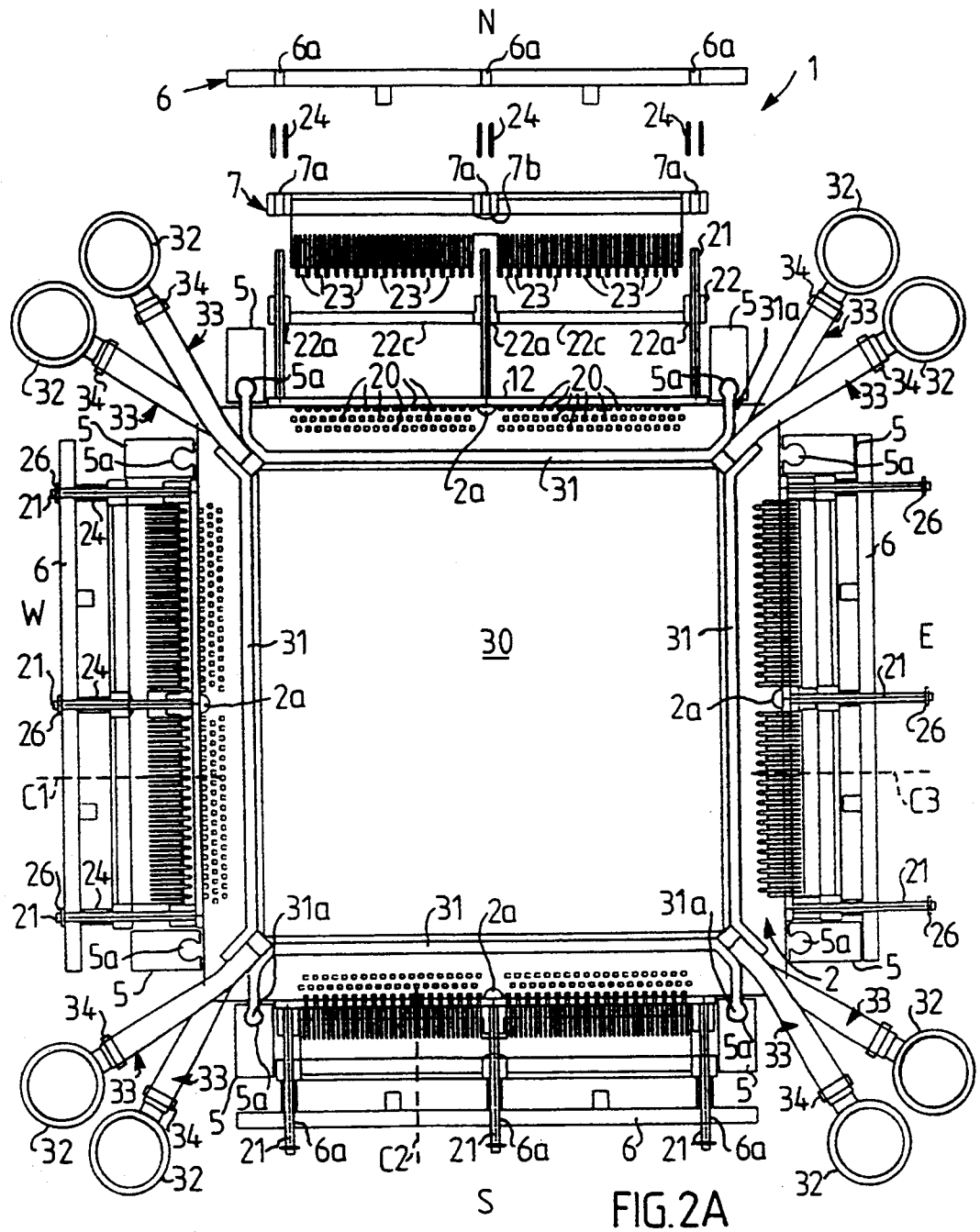
FIG. 2A shows, from above, a cut along the dashed line IIA of the housing in FIG. 1.
Figure 2B:
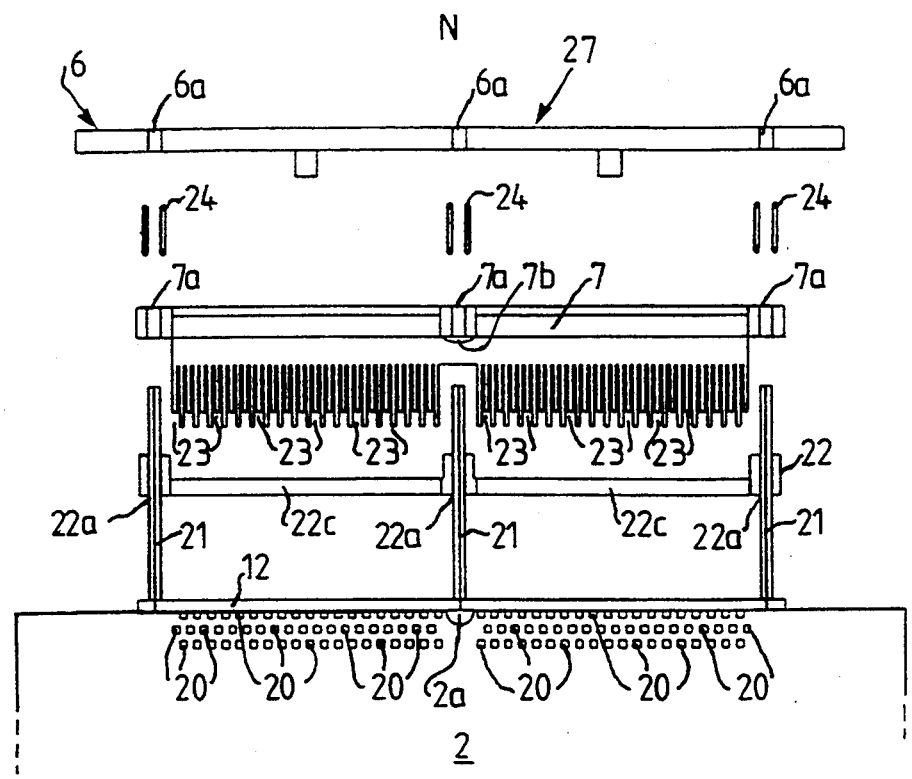
FIG. 2B shows the upper part of FIG. 2A in an enlarged scale.
Figure 2C:
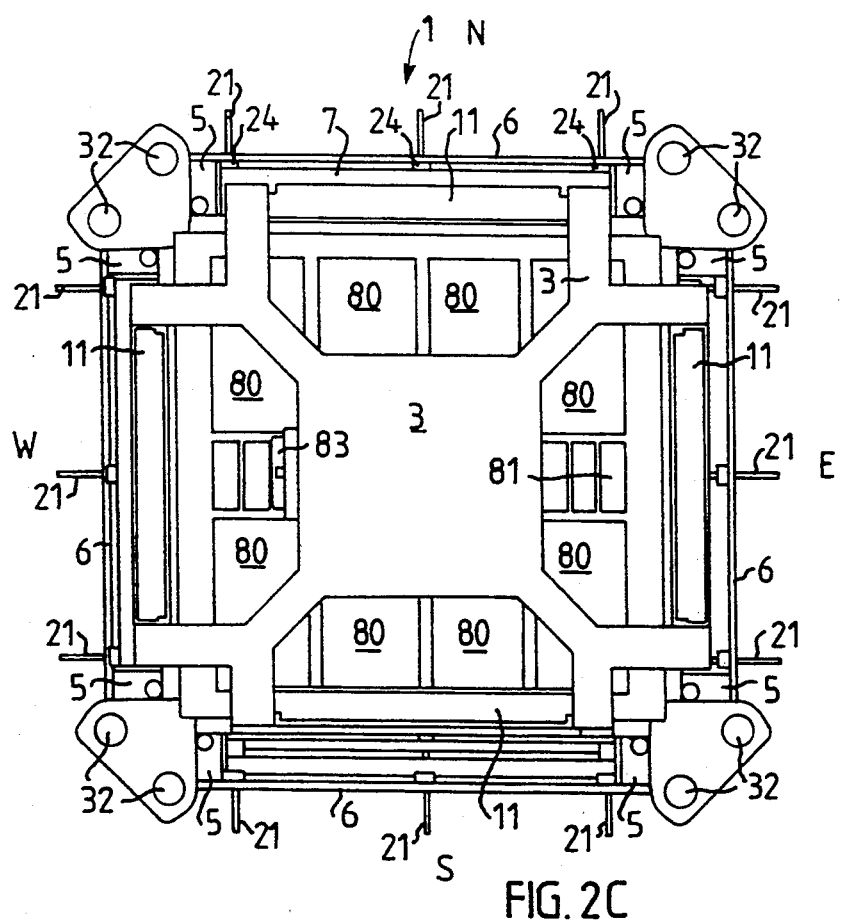
FIG. 2C shows, from above, schematically the structure of the housing in FIG. 1, FIG. 3A to E show side views of a first embodiment of a connector assembly in different insertion states.

Refering to FIGS. 1, 2A and 2C a housing 1 is provided, which can accomodate a plurality of packages 2. A package 2 could for instance be a substrate holding and supporting a chip or some other container for electrical circuitry, whereby electrical connection from the chip to the edges of the package can be provided by conductors buried in the substrate of the package. The chip, and thereby the package, could vary in size and even include an entire wafer. The present invention is particularly advantageous for large packages, which include large chips. Since the exact structure of the package is not a part of the actual invention it is not described in detail. A package, which can be provided as the package 2 in FIG. 1, is described in our copending application Ser. No. 07/844,989 Feb. 28, 1992.

The housing 1 includes a cage assembly, including two end frames 3,4 (of which one is shown in FIG. 2C) connected with each other by means of support rods 5. As can be seen from FIG. 1 the packages 2 are stacked on top of each other in the cage assembly. In the described embodiment there are 16 packages in the stack and each package is 6"×6" large. It is of course within the scope of the invention to provide a housing which can accomodate another number of packages, possibly being of a completly different size than the size suggested. The number of packages could for instance be 17.

FIG. 2A shows, from above, a cut along the dashed line IIA of the housing 1 in FIG. 1. The housing 1 is symmetrical—the four sides (North N, South S, West W, East E) look the same (see FIG. 2A and 2C) and the bottom looks the same as the top (see FIG. 1). In FIG. 1 four connector assemblies are provided; on side N the connector assembly and related parts are shown exploded (see also FIG. 2B), on side E the connector assembly is in place and contact is established between a package and a flat cable 10 (not shown in FIG. 2A), on side S and side W two intermediate steps are shown. The connector assemblies will be further explained in conjunction with the description of FIGS. 3A to 3E.

FIG. 2B shows the same connector assembly 27 with related parts on the side N of the housing 1 as in FIG. 2A, but enlarged.

The housing 1 in FIGS. 1, 2A and 2C includes means for:

a) supporting the packages mechanically,
b) supplying the packages with power,
c) cooling the packges, and
d) connecting the packages electrically.

Mechanical Support

The mechanical means could for instance, as shown in FIGS. 1, 2A and 2C, include a cage assembly, which mechanically supports the packages and other parts provided in the housing 1 and which includes two end frames 3,4, eight support rods 5 (of which only four can be seen in FIG. 1) and four backplanes 6.(of which only three can be seen in FIG. 1). It is obvious for a person skilled in the art to perceive similar alternatives. The mechanical support means cooperates with the cooling means and the electrical connection means in order to support the packages resiliently. The cage assembly is described further below.

Power Supply

The means for supplying power could include one or several traditional power supplies. Alternatively, the power supply means could include power supplies of the type described in our copending application Ser. No. 07/844,988 filed Feb. 28, 1991. Although aspects of the power supplies important to the present invention will be described further below, the exact structure of a power supply is not described in detail since it is not part of the present invention.

Cooling

For creating a thermal path from each package for dissipating the heat generated by the electric circuitry of the package, the cooling means includes a plurality of cooling units preferably containing a flowing cooling fluid, such as a liquid (e.g. water) or a gas (e.g. air). The cooling units are sandwiched with the packages 2 into a stack in which a cooling unit is provided both above and below each package 2. Tubes 32 for inlet and outlet of the cooling fluid in to and out from each cooling unit are provided in the housing. The thermal path is from the package through a cooling unit wall to the cooling fluid. The cooling fluid is put under pressure and it is preferred that at least the package facing walls of the cooling unit are made out of a flexible material. The flexible walls adjust in form to the surface of the package and good thermal conductivity can be obtained. The cooling means are described further below.

Electrical Connection

Figure 3A:
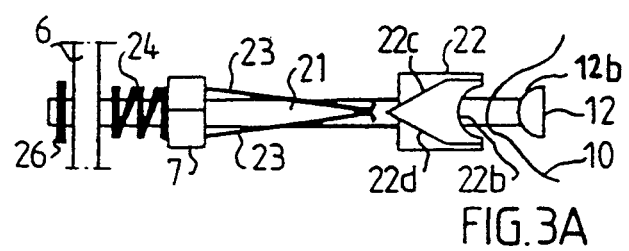
FIG. 3F shows, from the side, schematically the connector assemblies in FIGS. 3A to E in place over the packages.
Figure 3B:
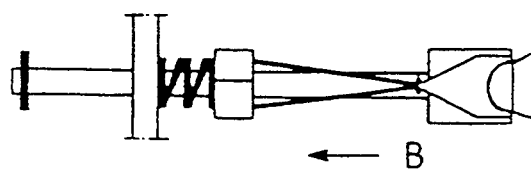
Figure 3C:
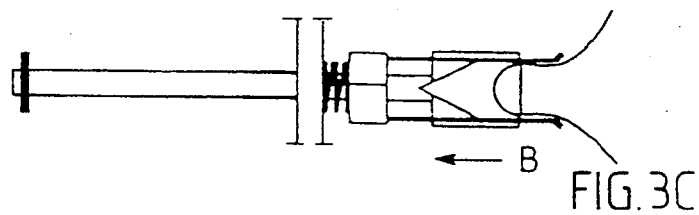
Figure 3D:
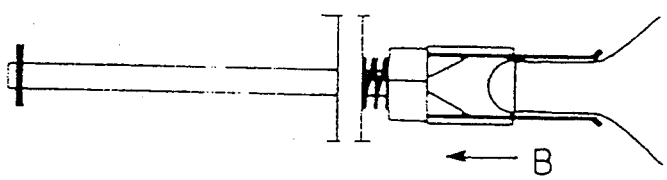
Figure 3E:
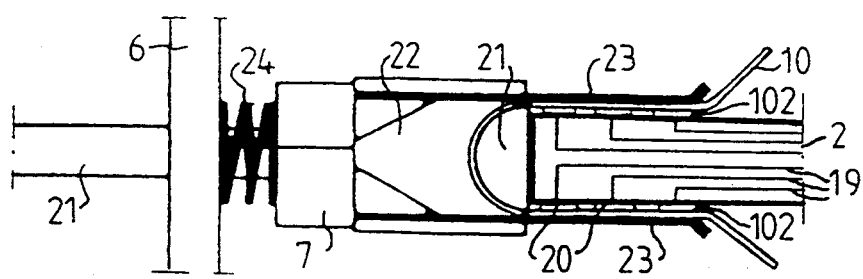
Figure 3F:
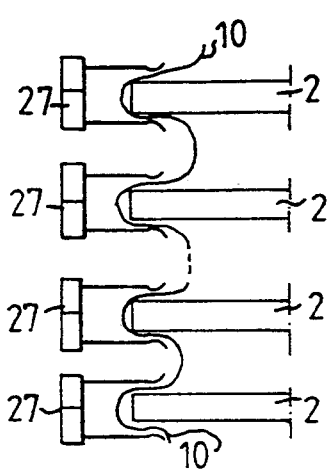

The packages 2 are connected electrically by a plurality of connector assemblies 27, whereby each connector assembly 27 could create contact to both sides of an individual package 2 (see FIG. 3F). As an alternative each connector assembly 27 creates contact between two packages 2, i.e. contact is created between the underside of one package 2 and the overside of the package below (see FIG. 7A).

According to the first embodiment the connector assemblies 27 provide springs on all four sides of a package. The springs could be integrated in the connector assemblies 27 connecting the packages electrically, whereby electrical contact can be maintained even if the package moves. The springloaded connection is also advantageous when it comes to allowing package size differences since a difference in size of a package only results in a different tension of the springs, i.e. greater tension for a larger package and a lesser tension for a smaller package. The size differences could for instance be caused by thermal expansion or wide manufacturing tolerances.

In order to allow data communication between the packages and possibly to the outside world, the packages are connected to each other and possibly to the outside world, e.g. a computer. In order to distribute power the packages are also connected to the power supplies. The electrical connection means, including the connector assemblies 27, are described further below.

The Subsystems of the Housing

The parts included in the housing 1 can be divided functionally into four main groups, where each group can be regarded as a certain subsystem providing a certain function/mechanism. Thus, the housing 1 includes means for:

| | |
|---|---|
| 1) electrical connection | 2) cooling |
| 3) mechanical support | 4) power supply. |

Notice that the above division is made for the purpose of clarity and that the subsystems actually co-operate and interact with each other to accomplish the objects of the invention. As an example, the cooling means also provides mechanical support to the packages. Another example is that resilient suspension of the packages is accomplished by the co-operation between the mechanical, cooling and electrical connection means.

Below, with reference to appropiate drawings, a detailed description of the subsystems included in the housing 1 will be given.

1) Electrical Connection

A first embodiment of the electrical connection means will be described below.

Further below, in conjunction with description of FIGS. 7A to 7C, a second embodiment of the electrical connection means will be described.

Electrical connection is provided by electrical connection means, which according to the invention includes four connector and wire assemblies, one for each side N,S,W,E of the housing 1. Each assembly includes a plurality of connector assemblies 27, at least one external terminal 11, and at least one flat cable 10.

According to a first embodiment of the connector and wire assemblies there are four flat cables 10, each flat cable possibly being in contact with an external terminal 11 at each end for connection with the outside and it is also in contact with each package 2 along one of the four sides N,S,W,E of the housing by means of the connector assemblies 27 at that side. In addition, the flat cables 10 along the sides N,S are connected to the upper power supply 8 and the flat cables 10 along the sides W,E are connected to the lower power supply 9. There are preferably four connector assemblies 27 connected to one package 2, one at each side N,S,W,E of the housing 1. As can be seen in FIG. 3F, in this embodiment each connector assembly 27 creates contact to both sides of an individual package 2. Data can be communicated from each package to every other package in the housing via the appropiate flat cable 10.

Figure 7A:
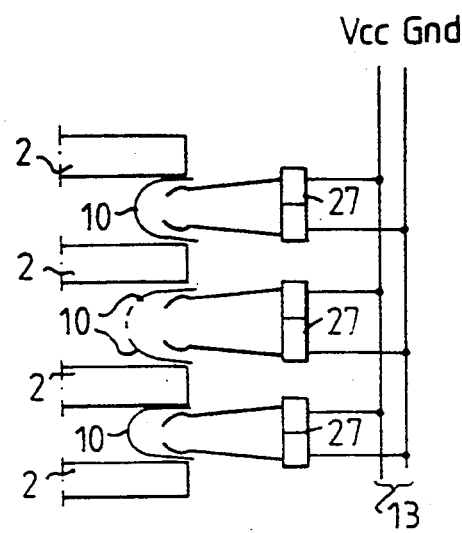
FIG. 7A shows, from the side, schematically a second embodiment of connector assemblies in place between the packages.

A connector assembly 27 provides the electrical contact between a package 2 and the flat cable 10 by pressing the flat cable 10 against the package 2 (see FIG. 3F and FIG. 7A).

A first embodiment of a connector assembly 27 shown from the side in FIG. 3A and from above in FIG. 2B includes three locking washers 26, three shock springs 24, one connector 7 provided with a plurality of contact springs 23, a guide 12 with three registration pins 21, a flat cable 10 and a contact spring separator 22, henceforth also called separator 22.

The Flat Cable 10

According to a first embodiment the four flat cables 10 are used for distribution of data and power and for establishing contact with the packages 2. Each flat cable 10 is a film including a plurality of layers, which for instance could include data or power wires or contact pads for contacting the packages. A flat cable 10 could for instance have the size 102×680 mm and the thickness 400 micrometer. Each layer could for example be built from a polymide base coated with copper.

Figure 4B:
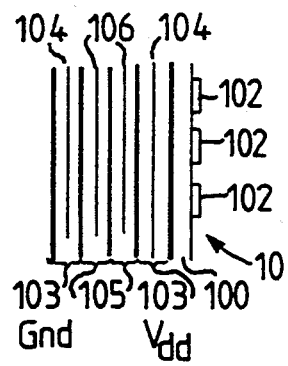
FIG. 4A to B shows a first embodiment of a flat cable incorporated in a housing according to the invention.
Figure 4A:
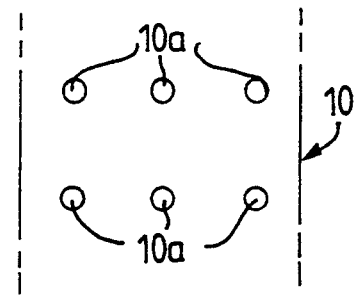

In the embodiment of a flat cable 10 shown in FIG. 4A, each flat cable is provided with a plurality of openings 10a in order to allow the flat cable 10 to be threaded onto the registration pins of all the connector assemblies on one side N;S;W;E of the housing 1. If there are sixteen connector assemblies provided on a side N;S;W;E, each connector assembly having three registration pins, which is the case in the preferred embodiment, there are sixteen times three, i.e. 48, openings 10a in each flat cable. In FIG. 4A two times three openings 10a are shown.

In the embodiment of a flat cable shown from the side in FIG. 4B, which could be included in a housing 1 according to the invention, five electrically conducting layers are provided:

- a contact pad layer 100 including a plurality of contact pads 102 for establishing contact with the package contact pads 20 of each package 2;
- two power wire layers 103 including at least two power wires 104 for distribution of power from a power supply 8 or 9 to each package 2;
- two data wire layers 105, between the two power wire layers 103, including a plurality of data wires 106 for communication and distribution of data among the packages and to/from the outside world through the external terminals 11 (see FIG. 1).

Contact Layer

A number of contact layer pads 102 are provided in the contact layer corresponding to the number of package pads 20 provided on the packages 2. The size of the flat cable contact pads 102 matches the size of the package contact pads 20. The size of the pads could be 1×1 mm.

Power Layers

At least one power wire Vdd is provided for the voltage supplied and at least one power wire Gnd (ground) is provided. In an embodiment of a flat cable 10 four power wires Vdd are provided in one power wire layer 103 and one power wire Gnd is provided in the second power wire layer 103. In this way a low impedance transmission can take place, which is important since the power includes very high frequency components, in the range of 100 MHz. Power is distributed as 5 V and typical current is 18 A.

Data Layers

According to one embodiment the data communication is performed on transmission lines, each using three wires 106 within the same data wire layer 105. In total there could be 32 transmission lines in each layer. The power wire layers 103 are placed on both sides of the data wire layers 105 (see FIG. 4B).

The Connector Assembly 27

The Connectors 7

As can be seen in FIG. 2A each package is provided with three rows of package contact pads 20 at each side N,S,W,E. Each package contact pad 20 is in contact with a conductor 19 (FIG. 3E), which is buried in the package substrate. For each of the four sides N;S;W;E the connection of each of the pads 20 to the flat cable 10 (see FIG. 3E) is provided by an individual contact spring 23 of the connector 7. Each connector 7 is provided with two horizontal rows of contact springs, each row including a number of contact springs 23 which could correspond to the number of package pads 20 to be contacted. The length of each contact spring corresponds to the distance that the contact spring has to extend over the package in order to establish contact with its corresponding package pad 20. The contact springs 23 could be long in order to take up large tolerances on the package thickness. Thus, each contact spring 23 could have one of three different lengths depending on in which row its corresponding package pad 20 is situated. It is of course within the scope of the invention to provide the package with another number of package pad rows, whereby the connector contact springs have a corresponding number of different lengths. As an alternative, all contact springs of the two horizontal rows could be of the same length, all being able to reach the package pad row furthest away from the edge of the package, whereby each contact spring could establish contact between a number of flat cable pads and a corresponding number of package pads 20.

The contact springs 23 in each horizontal row are formed in one unit, e.g. by pressing, which unit is integrated into one half of the plastic body of the connector 7. Two such units integrated in two such plastic body halves are mounted together, e.g. with a clips (not shown), to form one connector 7. The plastic body of the connector 7 is provided with a number of openings 7a corresponding to the number of registration pins of a guide 12 (see FIG. 2B). The contact springs 23 could be electrically isolated from the flat cable wires, e.g. by being coated by a plastic material or by means of an isolating layer in the flat cable facing the contact springs 23. As an alternative, some or all contact springs 23 could be in electrical contact with one or several package pads by means of direct ohmic contact, i.e. without the flat cable. This technique can be used to supply power, thereby eliminating the need for power layers and power wires in the flat cable 10, whereby power for instance could be supplied via power busses 13 (see FIG. 7A) to the contact springs in question by means of one or more electrical contacts provided at the back of the connector body.

For more exact positioning the center of the connector 7 is provided with a lip 7b, which fits in a corresponding cutout 2a provided in the package 2 (see FIG. 2B). Thus the connector registers accurately to the package.

The Guides 12

Each guide 12 is provided with a plurality of registration pins 21 adapted to pass through matching openings provided in the connector assembly elements. According to one embodiment each guide 12 is provided with three registration pins 21 and each connector assembly element is provided with three corresponding openings (see FIG. 2B). During preassembly of the connector assembly, the registration pins of the guide 12 are in turn passed through matching openings 10a provided in a flat cable 10, matching openings 22a provided in a separator 22, matching openings 7a provided in the body of a connector 7, through the shock springs 24 and finally through corresponding openings 6a provided in a backplane, thereby guiding the connector assembly elements (see FIG. 2B). The diameter of the openings 6a of a backplane 6 are larger than the diameter of the registration pins 21 in order to allow an individual connector assembly to move relative the backplane in question.

The Locking Washers 26

After the registration pins 21 have been passed through the openings of the connector assembly parts and the backplane, a locking washer 26 is mounted on each registration pin 21 in order to hold the connector assembly "hanging" in the backplane 6. The locking washers 26 are only needed to allow preassembly of the connector assemblies 27 and may be removed when the housing is assembled.

The Separators 22

When the preassembled connector assembly is to be put in contact with a package 2, the separator 22 separates the two horizontal rows of connector contact springs 23 in order to establish contact between the package pads 20 and the flat cable 10 (see FIG. 1 and FIG. 3E). In order to facilitate the separation of the two horizontal contact spring rows of a connector the separator 22 (see FIG. 3A) is provided with two sloping surfaces 22c, 22d which together form an arrow-shaped separator body pointing towards the connector 7. The sloping surfaces could extend along the full horizontal length of the separator 22. As an alternative, which is to preferable, the sloping surfaces 22c, 22d only extend along the horizontal sections which correspond to the horizontal sections of the connector provided with contact springs, i.e. along the full length except around the openings 22a.

The Shock Springs 24

One shock spring 24 is provided on each registration pin 21 in order to allow for package size variations and slight package movement and in order to help holding the connectors in place when connected.

FIGS. 3A and 3B show a connector assembly in the unconnected state as a side view of a cut along the dashed line C1 in FIG. 2A, i.e. as a cut through the connector assembly on the side W of the housing 1.

FIG. 3C shows a connector assembly in an intermediate state as a side view of a cut along the dashed line C2 in FIG. 2A, i.e. as a cut through the connector assembly on the side S of the housing 1.

FIGS. 3D and 3E show a connector assembly in the connected state as a side view of a cut along the dashed line C3 in FIG. 2A, i.e. as a cut through the connector assembly on the side E of the housing 1.

The same set of details are shown in FIG. 3A to 3D, therefore only FIG. 3A is provided with reference-numerals.

A guide 12 provides a film forming surface 12b and is shown in FIG. 3A. The guide 12 is also provided with three registration pins 21 (of which only one is shown in FIG. 3A), on which several connector assembly parts are mounted and on which the parts can slide. The parts can slide and be positioned since they are provided with openings corresponding to the registration pins 21 (see side N in FIG. 2A and 2B). Each registration pin 21 is put through a corresponding opening 6a in a backplane 6 and is provided with a locking washer 26 at the "non-package" end. The sliding parts include, in order from the "package" end, a separator 22, a connector 7 provided with contact springs 23, and a shock spring 24. The two horizontal contact spring rows press against each other in the unconnected state. The separator 22 is provided with a film forming surface 22b which fits with the film forming surface 12b of the guide 12.

In FIG. 3B the two matching film forming surfaces 12b and 22b are pushed together with the flat cable 10 fixed inbetween. The surfaces 12b, 22b have the function of positioning and smoothly bending the flat cable 10. As can be seen in FIG. 3B the contact springs 23 of the connector 7 are in contact with the separator 22, which in FIG. 3C has separated the contact springs 23 due to a pushing movement in the direction of the arrow B.

In FIG. 3D the connector 7 is in place and contact is established between the flat cable 10 and the package in question (see FIG. 3E). As can be seen in FIG. 3D the shock spring 24 is slightly tensioned, which helps holding the connector 7 in place.

FIG. 3E shows the connector 7 in place over the edge of a package. The contact springs 23 of the connector 7 press the contact pads 102 of the flat cable 10 against the package pads 20, whereby electrical contact is established. The package pads 20 are in contact with conductors 19 buried in the substrate of the package 2.

The External Terminals 11

FIG. 2C shows four external terminals 11 mounted to the top end frame 3. There is preferably one external terminal 11 electrically connected to each end of each flat cable 10. If there are four flat cables 10 in an embodiment of a housing 1 then there are eight external terminals 11 provided, four at each end of the housing 1.

The external terminals 11 are used for data communication from the packages 2 to "the outside world" and to the packages 2 from "the outside world". The outside world could for instance be a conventional computer, e.g. a PC, workstation or a mainframe computer, an external network or another stack of packages. It is obvious for a person skilled in the art to perceive other possibilities, e.g. connecting a plurality of housings 1 whereby the electrical connection could be provided by connecting the external terminals 11.

The external terminals 11 could be standard type terminals, e.g. a socket with a corresponding plug which fits into the socket, i.e. a plug and socket arrangement. In FIG. 2C four standard type sockets are provided as the four external terminals 11. The only requirement is that the terminal 11 used has to be able to establish contact with at least some of the data wires in the flat cable.

In applications of the invention where no external communication is required the external terminals 11 could be left out.

2) COOLING

In order to provide a cooling mechanism for the cooling of each individual package in the housing 1 a plurality of cooling units are provided inbetween the packages. Or more specifically; one cooling unit is provided on top of each package and an additional cooling unit is provided inbetween the lower power supply 9 and the bottom package in the stack (see FIG. 1). The cooling units preferably contains a liquid as cooling fluid, e.g. water. Alternatively, the cooling fluid could be a gas, e.g. air.

Cooling Means

Cooling of each package 2 is provided by cooling means including a plurality of cooling units provided with inlets 30a and outlets 30b for allowing the cooling fluid to flow through the unit in question, each unit including or being supported by a cooling unit frame 31. The cooling means further includes a plurality of tubes 32 for transporting the cooling fluid, tube connections 33 for connecting the cooling unit inlets 30a and outlets 30b to the tubes 32, tube clamps 34 for holding the tube connections in place, and a plurality of end clamps 35 placed at the open ends of the tubes.

Cooling Unit Walls

At least the package facing walls of the cooling unit 30, 31, 33, 34 are made of a flexible material which adjust in form to the package surfaces due to the cooling fluid pressure. Each cooling unit 30, 31, 33, 34 includes a cooling unit frame 31 providing rigid walls perpendicular to the package facing walls of the cooling unit 30, 31, 33, 34. The rigid walls restrict the direction of the cooling unit expansion, which is caused by the fluid pressure, so that the cooling unit expand towards the packages, putting the flexible walls in pressurized contact with the packages, which creates good thermal conductivity.

The Cooling Unit Frame

Figure 5A:
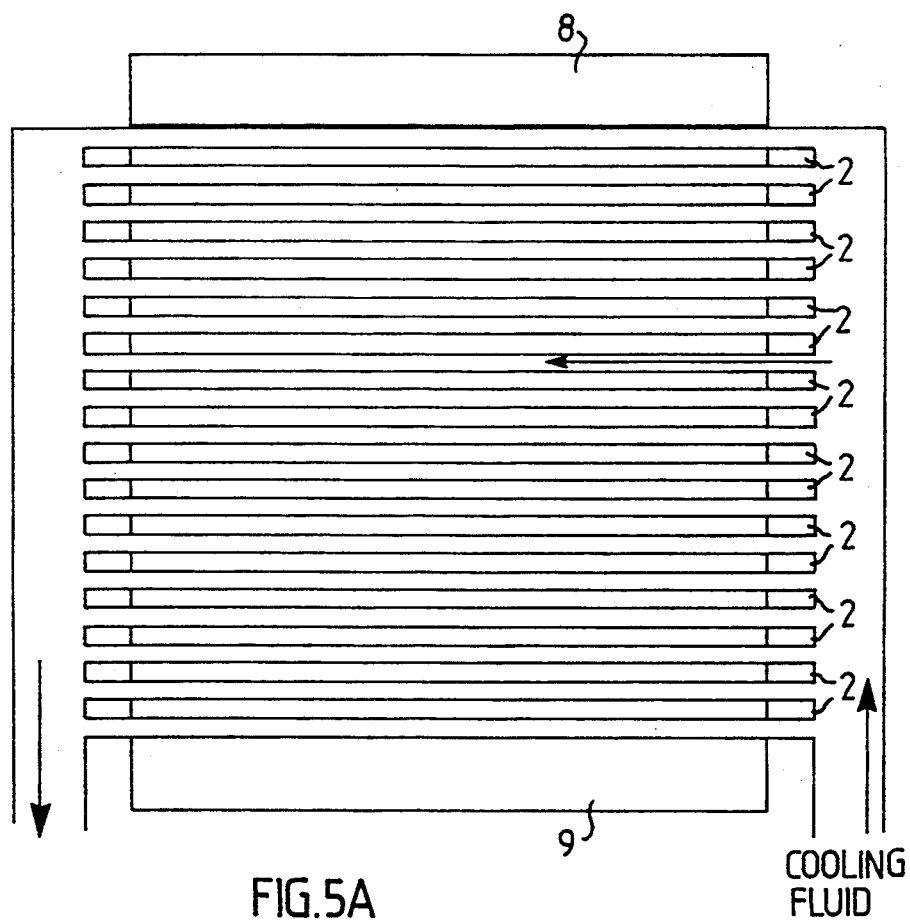
FIG. 5A shows, from one side, schematically the structure of a housing and the flow of a cooling fluid in the housing.
Figure 5B:
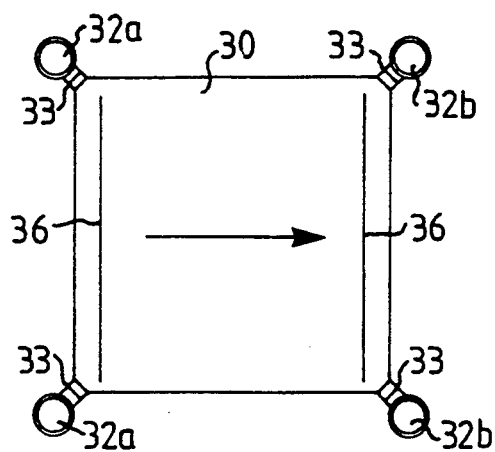
FIG. 5B shows, from above, an embodiment of a cooling bag, which could be used in a housing according to the invention.
Figure 5C:
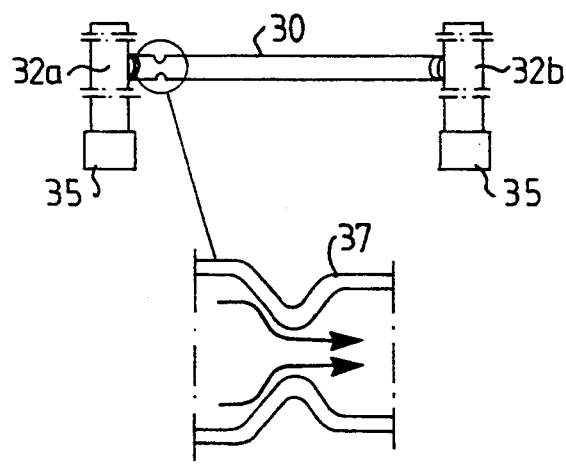
FIG. 5C shows, from the side, an embodiment of a cooling bag and a flow throttle, which could be used in a housing according to the invention.
Figure 5D:
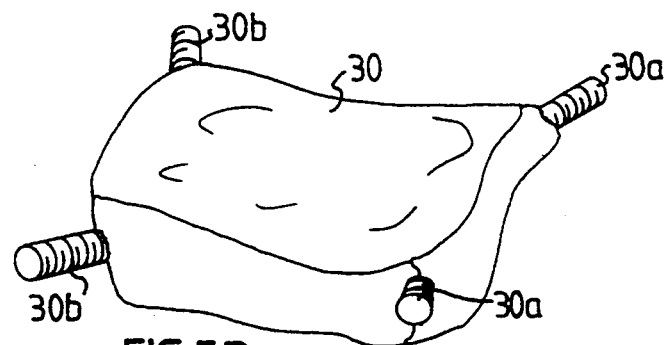
FIG. 5D shows a perspective view of the cooling bag in FIG. 5B.
Figures 5E, 5G, 5H:
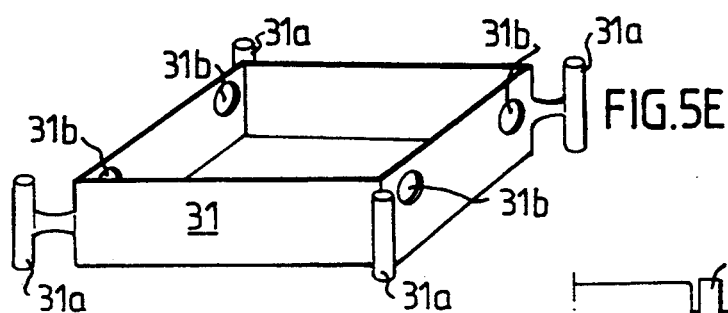
FIG. 5E shows a perspective view of a cooling unit frame, which can hold the cooling bag in FIG. 5D.
FIG. 5G shows, from the side, the cooling bag of FIG. 5D removably held in the cooling unit frame of FIG. 5E.
FIG. 5H shows, from the side, the cooling bag of FIG. 5D fixedly attached to the cooling unit frame of FIG. 5E.

FIG. 5E shows a cooling unit frame 31 provided with projections 31a with a certain height, whereby the frames 31 could be stacked on top of each other in the housing 1, thereby governing the minimum distance between the packages 2. Each cooling unit frame 31 is supported by a plurality of support rods 5 as will be described further below, in the mechanical support section.

Alternative 1: Separate Cooling Bag

Each cooling unit could include a cooling bag 30 made out of a flexible material, preferably a polymer material, which bag 30 is placed in the supporting cooling unit frame 31, which holds the bag 30 during assembly and non-pressurized periods. The bag 30 is removably mounted to the frame 31, which is shown in FIG. 5G.

A cooling bag 30 is shown from above in FIG. 5B, in which the arrow indicates the direction of flow. The inlets 30a and outlets 30b of the cooling bag 30 of FIG. 5B are connected to a set of four tubes 32, two inlet tubes 32a and two outlet tubes 32b by means of tube connections 33. A cooling bag 30 provided with inlets 30a and outlets 30b extending slightly from the bag 30 is shown as a perspective view in FIG. 5D.

A cooling frame 31 for holding the bag 30 of FIG. 5D is shown as a perspective view in FIG. 5E. The cooling frame 31 is provided with four openings 31b through which corresponding inlets 30a and outlets 30b of the bag 30 can be put, whereby the inlets 30a and outlets 30b could be threaded short metal pipes fixed to the frame 31 by nuts (not shown).

Alternative 2: Several Section Cooling Unit

Figures 5F, 5K:
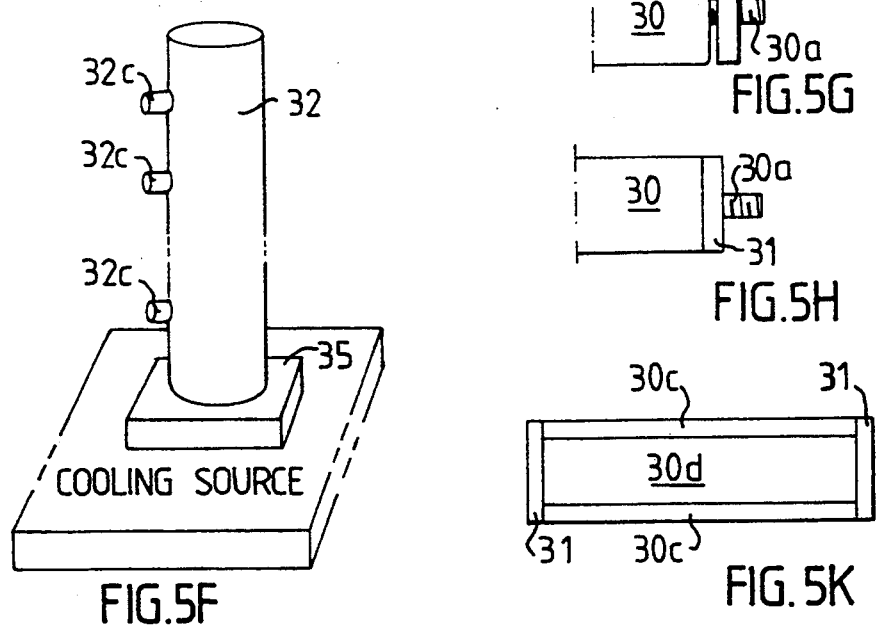
FIG. 5F shows a perspective view of a tube for transporting the cooling fluid.
FIG. 5K shows a side view of a second embodiment of a cooling bag.

As a second alternative, which is illustrated in FIG. 5K, each cooling unit includes a plurality of separate sections, preferably one separate section in which the cooling fluid is stationary, henceforth called the stationary section 30d, and two separate sections along the flexible package facing walls in which the cooling fluid is flowing, henceforth called the flowing sections 30c. The stationary section 30d preferably contains a pressurized fluid and is preferably provided with at least slightly flexible walls, each wall separating the stationary section 30d from the flowing sections 30c. Each flowing section 30c is provided with at least one inlet and one outlet. All sections are removably or fixedly mounted to the cooling unit frame 31.

Alternative 3: Flexible Frame Walls

As a third alternative each cooling unit includes four supporting rigid walls forming a cooling unit frame 31, perpendicular to and attached to the two flexible package facing walls, forming a box-like unit. This alternative is illustrated in FIG. 5H, in which the flexible walls are fixedly mounted to the frame 31.

Alternative 4: Integrated Cooling Bag

As yet another alternative, the cooling unit frame 31 is integrated in a cooling bag 30, whereby the rigid walls of the cooling unit frame are fixed to the inside of the cooling bag 30.

The Tubes

In an embodiment of the cooling means there are eight tubes 32 held in place by the support rods and/or the end frames 3,4. In FIG. 2C the tubes 32 are mounted to the support rods 5. Each tube 32 is provided with a plurality of openings 32c for inlet of the cooling fluid to the cooling unit and/or outlet of the cooling fluid from the cooling unit (see FIG. 5F). As shown in FIG. 5F the tube openings 32c could extend horizontally from the tube 32 creating a short pipe to which one end of a tube connection 33 could be attached by means of a tube clamp 34, whereby the cooling unit end of the tube connection 33 could be permanently fixed in the cooling unit or as an alternative be attached to it by means of another tube clamp 34. A set of four tubes are connected to each cooling unit by means of four tube connections 33. Two of the tubes 32 act as inlets and two of the tubes 32 act as outlets.

The End Clamps

Each tube, or alternatively each pair of tubes, is provided with an end clamp 35 located at the bottom end of each pair of tubes 32 for keeping the pressure of the cooling fluid when the tubes are disconnected, i.e. the cooling fluid should remain in the cooling system of the housing 1 even if disconnected from a cooling fluid source (see FIG. 5F). The end clamps automatically close the openings when the cooling means are disconnected, thereby preventing leakage of the cooling fluid. The end clamps 35 could be of snap type.

Since the exact structure of the cooling fluid source is not a part of the actual invention it is not further described.

Thermal Conductivity

The flow of a cooling fluid through the cooling system is shown schematically in FIG. 5A, where the direction of the flow is indicated by the arrows. The cooling fluid is put under pressure and flows from the inlet tubes 32 to the outlet tubes 32 through the cooling units, thereby cooling the packages 2. The thermal path is from the package to the cooling fluid through the flexible walls of the cooling unit, which have to sustain the pressure forces, which is why a sufficiently strong material is to be preferred, e.g. polyamide laminated by polythene. Since at least the package facing walls are flexible there will be good thermal conductive contact when the cooling fluid pressure causes the bag walls to press against the package. Assuming walls made of a polymer material with 0.25 mm thickness, and thermal conductivity of 0.2 W/K*m a thermal resistance of 83 mK/W results. For a typical power dissipation of 180 W the temperature drop is 15.0K. Using materials with better conductivity will increase the temperature drop.

As an alternative, or a complement, contact pressure between the cooling units and the packages in the stack can be provided by tightening a mechanical joint, which is mounted over the stack. The mechanical joint can include support rods which can be tightened by screws, which will be described further below, in the mechanical support section.

A cooling bag 30 and a flow throttle 37 is shown from the side in FIG. 5C. The arrows indicate the direction of flow. Even though there are preferably seventeen cooling bags 30 in this embodiment, for simplicity only one is shown in FIG. 5C.

Flow Control Means

Each cooling unit could be provided with one inlet 30a and one outlet 30b, or alternatively, with two inlets 30a and two outlets 30b, which is to be preferred. By increasing the number of cooling unit inlets and outlets the cooling fluid could be more evenly distributed. As an alternative to increasing the number of cooling unit inlets and outlets the cooling means can be provided with flow control means to control the cooling distribution, e.g. the flow rate can be controlled to increase/decrease the cooling of specific areas or for ensuring even cooling of an area or both.

Two embodiments of flow control means are shown in FIGS. 5B and 5C, respectively. In FIG. 5B the cooling bag 30 is provided with walls 36 provided with nozzle holes and placed to form a channel together with the inlet and outlet edge. In FIG. 5C the cooling bag 30, now seen from the side, is provided with a flow throttle 37 for increasing the flow rate. Alternatively, the flow rate can be increased by inserting horizontal planes (not shown) in the cooling bag which decreases the vertical cross-sectional area of the bag.

The flow throttle 37 in FIG. 5B can be used to compensate for the cooling fluid pressure drop. Without any flow control means the cooling fluid pressure is less in the cooling bags 30 further away than in bags 30 closer to the cooling fluid source. By providing the bags 30 with differently sized flow throttles 37, i.e. bags 30 closer to the cooling fluid source are provided with throttles with smaller openings and bags 30 further away are provided with throttles with larger openings, the cooling fluid pressure drop can be compensated and the fluid pressure can be close to the same in all cooling bags 30.

A person skilled in the art will perceive other alternatives for controlling the flow and thereby the cooling distribution.

3) Mechanical Support

In a first embodiment of the present invention the packages 2 are supported mechanically by a cage assembly 3,4,5,6 including two end frames 3,4, eight support rods 5 (of which only four can be seen in FIG. 1) and four backplanes 6 (of which only three can be seen in FIG. 1). It is obvious for a person skilled in the art to perceive similar alternatives.

Further mechanical support is provided by the plurality of resilient connector assemblies 27. For each package 2 there are preferably four connector assemblies 27, each having a multitude of connector elements. The resilient connector assemblies 27 allow each package 2 in the stack to move slightly in order for them to take up package size differences.

The support rods 5 could be made of extruded aluminum. In an embodiment of the present invention there are two support rods on each side of the housing 1 (see FIG. 2A and 2C). Or more sepecifically; there are eight support rods 5, one on each side of each of the four corners of the housing 1. Along the full length of one side of each support rod 5 there is a slot 5a, which in shape corresponds to the shape of projections 31a provided on the cooling unit frame 31 (see FIG. 5E). By placing each of the four projections 31a of each cooling unit frame 31 in a corresponding slot 5a in four of the support rods 5, the cooling means are supported mechanically. In addition, the distance between two packages is governed by the height of the cooling unit frame 31 or the height of the projections 31a of the cooling unit frame. The cooling unit frames 31 reinforce the cage assembly and provide added mechanical support by the manner in which they are mounted in the support rods 5.

In FIG. 2C, the housing 1 is shown from above. The two end frames 3,4 are mounted on the support rods 5, e.g. by using screws. In addition, the upper power supply 8 is mounted to the top end frame 3, as shown in FIG. 2C, and the lower power supply 9 is mounted to the bottom end frame 4, in the same way as shown in FIG. 2C for the top end frame 3. Each end frame could be shaped like a double-crossed H (see FIG. 2C). The end frames take up the pressure acting towards the power supplies by supporting the power supplies in a plurality of points. The end frames could also act as holders for the tubes 32. As an alternative the tubes are mounted to the support rods 5.

The four backplanes 6 are mounted on the support rods 5, e.g. by screws (not shown). The backplanes 6 could for instance be made of a molded plastic material and could be provided with a plurality of openings 6a (see FIG. 1) through which the registration pins 21 can extend. The openings 6a of each backplane 6 provide a coarse positioning of the connectors 7 and also allow preassembly of the connector assemblies 27. The positioning is coarse since the openings 6a are larger than the corresponding registration pins 21.

4) Power Supply

Each of the power supplies include several power supply units operating in parallel—if one power unit fails the other units remain in operation. This technique increases the reliability.

Refering to FIG. 1 power is supplied to the packages 2 by an upper power supply 8 and a lower power supply 9. The upper power supply 8 is mounted at the top in the cage assembly 3,4,5,6 and the lower power supply 9 is mounted at the bottom in the cage assembly 3,4,5,6.

Figure 6A:
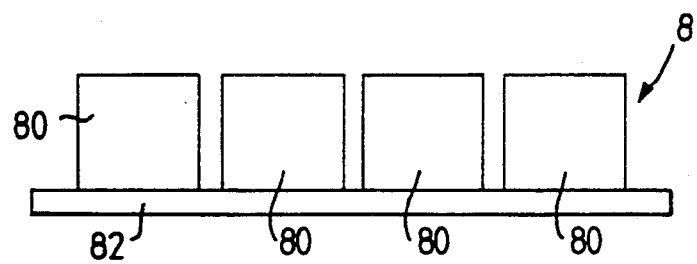
FIG. 6A shows, from the side, an embodiment of power supply means provided in a housing according to the invention.
Figure 6B:
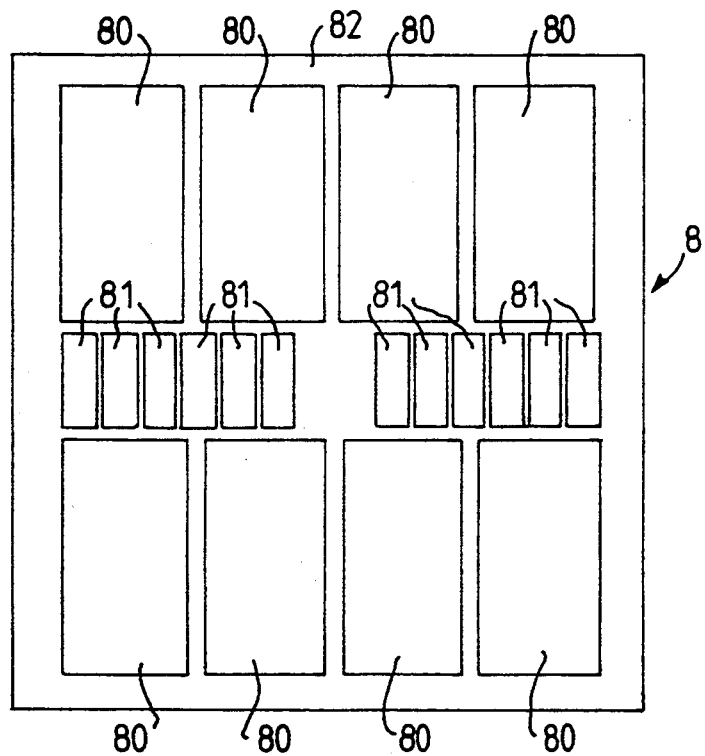
FIG. 6B shows, from above, the power supply means in FIG. 6A.

FIGS. 6A and 6B shows an embodiment of a power supply 8, 9, which could be provided in the housing 1 according to the invention. According to one embodiment, the housing 1 is provided with two power supplies 8, 9 of this kind. The lower power supply 9 is similar to the upper power supply 8, except for that it is mounted at the bottom of the housing instead of at the top. Another difference is that they are rotated 90 degrees relative each other. For the purpose of simplicity, only the upper power supply 8 will be described below.

The upper power supply 8 in FIGS. 6A and B includes a plurality of power supply units 80, henceforth also called power units, and a plurality of high current capacitors 81 (see FIG. 6B), henceforth also called capacitors. The number of power units 80 is preferably eight for each power supply and the number of capacitors 81 is preferably twelve for each power supply. Since the exact structure of the power unit 80 is not a part of the actual invention it is not described in detail. A power unit which can be provided as the power unit 80 in FIG. 6B is described in our copending application Ser. No. 07/844,988 filed Feb. 28, 1992.

All power units 80 are connected to one high voltage mains connector 83 (see FIG. 2C), e.g. 311 V DC (Direct Current). The mains is decoupled by the high current capacitors 81, which for example could have the characteristics 0.47 microF/400 V.

The power supply shown in FIGS. 6A and 6B is mounted on a heat sink 82, whose underside is in contact with a cooling bag 30. The heat sink 82 also provides mechanical support against the cooling bag pressure. The heat sink 82 could be made of a metal or some kind of ceramic material.

The two end packages in the housing could include transformers for the power supply means 8;9.

Power is distributed from the power supplies 8,9 to the packages 2 by a plurality of flat cables 10 including power wires or by a plurality of power busses 13. Each power supply 8;9 supplies two sides each. This has been described above in conjunction with the description of the electrical means.

As an alternative for supplying power a plurality of power busses 13 could be provided in the housing, separate from the flat cables 10 (see FIG. 7A). This scheme is described further below in conjunction with the description of a second embodiment of the housing 1. The housing could be provided with sixteen Vcc busses, eight from the upper power supply 8 and eight from the lower power supply 9.

Tolerances, Vibrations and Shock

Because the connector assemblies 27 are provided with shock springs, preferably three at each side of the package, the packages are allowed to move slightly in the horizontal plane. Thus at high frequency vibrations the cage assembly forms one unit and each package with four connector assemblies 27 form one unit. The units are physically connected by springs and the cooling fluid pressure.

When the cooling units are in pressurized contact with the packages by means of the pressurized cooling fluid, the cooling units in the stack together form a large "cushion" absorbing shocks and vibrations. In addition, the "cushion" allows the packages to move sligthly in the vertical direction.

The cooling units also provides mechanical support in that the friction caused by the pressurized contact with the packages "stabilizes" the packages in the stack, preventing them from moving around to much in the cage assembly. If for example the cooling fluid is under pressure, about 100 Kpa, the forces between the cooling bag 30 and the package is about 1,5 kN. This force causes friction which may sustain side forces of approximately 500 kN. Thus the package movement in the horizontal plane is, in most cases, caused by the torsion of the cooling bags, e.g. when the housing is tilted.

The horizontal component of a force caused by a shock is handled by the support rods 5 and/or the shock springs of the connector assemblies and the vertical component is handled by the flexible cooling units. They work in cooperation with each other in order to absorb external forces. When a shock causes horizontal package movement, the packages press against one, or possibly two of the sides of the housing, i.e. against the backplanes on these sides, whereby the support rods 5 take up the forces.

Manufacturing of the parts included in the housing does not have to fulfill restrictive tolerance requirements since the parts and the housing are designed to allow for wide tolerances. As an example, the packages do not have to be of exactly the same size since they are connected with springloaded connector assemblies 27. Another example is that a fairly large pad size, e.g. 1×1 mm, can be provided because of the large package size, e.g. 6×6 inches. This also ensures easy assembling.

Assembly

Below a method for assembling the housing, the method including the steps of:
a) preassembling the housing,
b) preassembling the four sides of the housing, each side including a backplane 6 provided with a plurality of connector assemblies 27,
c) assembling the housing, including inserting the packages 2 into their respective position in the preassembled housing resulting from step a),

Preassembling the Housing

In order to preassemble the housing the following steps could be performed:
a) mounting a plurality of support rods 5 on three sides of a bottom end frame 4,
b) positioning a plurality of tubes 32 in place and preassembling tube connections 33 loosely,
c) inserting a cooling unit frame 31 by placing its projections 31a in the slots 5a of the support rods 5,
d) mounting a cooling bag 30 to the corresponding tube connections 30 with tube clamps 34,
e) repeating the steps c) and d) until all cooling bags and cooling unit frames are in position,
f) mounting a top end frame 3 on top of the support rods 5.

Preassembling the Sides of the Housing

In order to preassemble the sides of the housing, the following steps could be performed:
a) placing a plurality of guides 12 provided with registration pins 21 in an assembly fixture,
b) threading a flat cable 10, which is provided with openings 10a corresponding to the registration pins 21, onto the guides 12,
c) mounting a separator 22, which is provided with openings 22a corresponding to the registration pins 21, onto each guide 12,
d) mounting a connector 7, which is provided with openings 7a corresponding to the registration pins 21, onto each guide 12,
e) mounting a shock spring 24 on each registration pin 21,
f) mounting a backplane 6, which is provided with openings 6a corresponding to, but being larger than, the registration pins 21, onto the registration pins 21,
g) mounting a locking washer 26 on each registration pin 21.
h) repeating the steps a) to g) until all sides are preassembled.

Final Assembly

In order to finally assemble the housing, including inserting the packages 2 into their respective position in the preassembled housing (see above), the following steps could be performed:
a) mounting the support rods 5 on the fourth side of the bottom end frame 4,
b) mounting each preassembled side, positioning and pushing the preassembled connector assemblies 27 into place on the packages and securing the backplane against the support rods 5,
c) connecting the flat cables 10 to the power supplies,
d) mounting the tubes 32 to external hoses of an external cooling device providing the cooling fluid,
e) mounting the housing in the desired external environment, e.g. in a box.

A Second Embodiment

A second embodiment of a housing according to the invention will be described below. In this second embodiment the housing is provided with connector and wire assemblies of a different kind than in the first embodiment described above.

The Connector and Wire Assembly

According to a second embodiment of the connector and wire assemblies there are a plurality of flat cables 10, preferably four flat cables 10 per package, i.e. one flat cable 10 per side N,S,W,E of the package 2. The flat cables in contact with the end packages could also be connected to external terminals 11 for external data communication. In this embodiment, illustrated in FIG. 7A, each connector assembly 27 creates contact between two packages 2, i.e. contact is created between the underside of one package 2 and the overside of the package below 2. In addition to the flat cables 10 the wiring includes a plurality of power busses 13, which are connected to the power supplies and which extend along the full length of each side N,S,W,E of the housing 1.

There are preferably eight power busses 13 per side N,S,W,E of the housing, each power bus 13 preferably including at least one power wire Vcc and at least one power wire Gnd and each power bus 13 preferably being connected to a power unit 80. Data can be communicated from each package to every other package in the housing via intermediate packages and flat cables 10 situated inbetween the two packages that need to communicate.

The Flat Cable 10

The plurality of flat cables 10 are used for distribution of data and for establishing contact with the packages 2. Each flat cable 10 is a film including at least one electrically conducting layer, which includes data wires 106 and/or contact pads 102 for contacting the packages. Power is supplied directly to the power package pads 20b via some of the plurality of contact springs 23 provided by each connector assembly 27, the power supplying contact springs 23b being in contact with the power busses 13, thereby eliminating the need for power wires (and power wire layers) in the flat cable 10. The signal contact springs 23a are electrically isolated from the flat cable 10, each signal contact spring 23a having the function of establishing a point of contact between a number of contact pads 102 of the flat cable 10 and a corresponding number of signal package pads 20a. The number of contact points established by each individual contact spring 23 could be chosen according to the application.

Figure 7B:
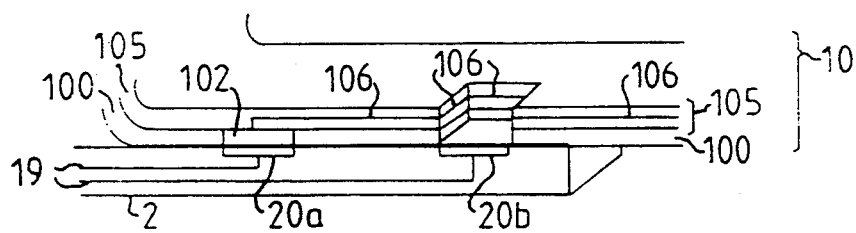
FIG. 7B shows, as a perspective view, a second embodiment of a flat cable on top of a package.

In the embodiment of a flat cable 10 included in FIG. 7B, two electrically conducting layers are provided:
- a contact pad layer 100 including a plurality of contact pads 102 for establishing contact with the package contact pads 20a of a package 2;
- a data wire layer 105 including a plurality of data wires 106 for communication and distribution of data among the packages and to/from the outside world through the external terminals 11 connected to the flat cables of the end packages. If no external communications is needed in the application of the invention the external terminals 11 could be left out.

Contact Layer

A number of contact layer pads 102 are provided in the contact layer corresponding to the number of package pads 20 provided on the packages 2. The layer itself is preferably electrically isolating, except for the contact pads 102. The size of the flat cable contact pads 102 matches the size of the package contact pads 20. The size of the pads could be 1×1 mm.

Data Layer

The embodiment of a flat cable included in FIG. 7B only includes one data wire layer 105. More than one layer could be provided, e.g. because of that an increased number of data wires has to be provided. According to one embodiment the data communication is performed on transmission lines, each using three wires 106 within the same data wire layer 105. In total there could be 32 transmission lines in each layer.

Power Supply

Figure 7C:
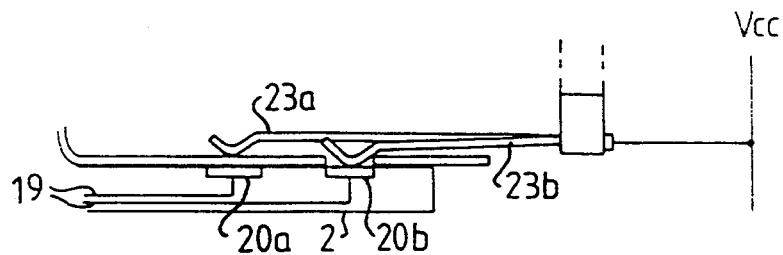
FIG. 7C shows, from the side, the second embodiment of a connector assembly in contact with the arrangement in FIG. 7B.

Power could be supplied by providing holes in the flat cable, which holes are situated to match the power package pads 20b, whereby the power supplying contact springs 23b of each connector assembly 27 contacts the power package pads 20b directly, through the holes of the flat cable 10 (see FIG. 7C). The power supplying contact springs are connected to the power supply busses 13 (see FIG. 7A and 7C).

At least one power wire Vcc and at least one power wire Gnd (ground) are provided in each power bus 13. There are preferably eight power wires Vcc and eight power wires Gnd provided in the power busses 13 according to this embodiment.

The Connector 7

In this second embodiment, each connector assembly only includes a connector 7 provided with two horizontal rows of contact springs 23. The connectors 7 in this second embodiment are similar to the connectors 7 provided in the first embodiment, except for the contact springs 23, which in this embodiment are separated in the untensioned state, i.e. the two horizontal rows of contact springs 23 do not, as is the case in the first embodiment, press against each other at rest—they extend away from each other at rest.

In this embodiment, the connector assemblies 27 only register to the packages by means of the contact springs 23, thereby eliminating the need for the lips 7b of the connectors 7 and the cutouts 2a of the packages 2.

In addition, the connector assemblies 27 do not have to register to the cage assembly, thereby eliminating the need for the openings 6a in the backplanes 6, the shock springs 24, the locking washers 26, the guides 12, the separators 22, and the openings 7a of the connectors 7. In this second embodiment the packages 2 register to the support rods of the cage assembly by means of minimal clearance.

FIG. 7A shows the second embodiment of the connector assemblies 27 in place between the packages, establishing contact between adjacent packages. The contact is established by means of the two horizontal rows of resilient contact springs 23 provided in each connector 7. Some of the contact springs 23b are in electrical contact with a power bus 13, e.g. by means of an electrical connection provided at the back of each connector 7, as well as in direct ohmic contact with the power package pads 20b, e.g. through holes provided in the flat cable. The other contact springs 23a could be electrically isolated and are establishing electrical contact between the flat cable contact pads 102 and the signal package pads 20a by pressing the flat cable 10 against the package 2.

In FIG. 7B a flat cable 10 is shown in place on top of a package 2. The shown flat cable 10 includes one data wire layer 105 provided with a data wire 106 and one contact pad layer 100 provided with one electrically conducting contact pad 102. The shown package 2 includes two conductors 19 and two package pads 20, one power package pad 20b and one data package pad 20a. The hole provided in the flat cable 10 in FIG. 7B allows a contact spring 23 (not shown in FIG. 7B) to contact the power package pad 20b. This is shown in FIG. 7C, in which a power supply contact spring 23b is in contact with the power package pad 20b.

In this embodiment the backplanes could hold the power busses 13 and provide mechanical support to the cage assembly.

While the invention has been described with reference to specific embodiments, it will be understood by those skilled in the art that various changes may be made and equivalents may be substituted for elements thereof without departing from the true spirit and scope of the invention. In addition, modifications may be made without departing from the essential teachings of the invention.

APPENDIX 1

This appendix shows a list of parts or details of parts, each provided with a corresponding reference-numeral, the list being ordered in reference-numeral order.

housing 1
package 2
cut-out 2a
cage assembly 3, 4, 5, 6
top end frame 3
bottom end frame 4
support rod 5
slot 5a
backplane 6
backplane opening 6a
connector 7
connector opening 7a
connector lip 7b
upper power supply 8
lower power supply 9
flat cable 10
flat cable opening 10a
external terminal 11
guide 12
power bus 13
power wire Vcc, Gnd
film forming surface 12b
conductor 19
package contact pad 20
data package pad 20a
power package pad 20b
registration pin 21
separator 22
separator opening 22a
film forming surface 22b
sloping surfaces 22c, 22d
contact spring 23
data contact spring 23a
power contact spring 23a
shock spring 24
locking washer 26
connector assembly 27
connector and wire assembly 27, 10
Electrical connection means 27, 10, 11
cooling unit 30, 31, 33, 34
cooling bag 30
cooling bag inlet 30a
cooling bag outlet 30b
cooling unit frame 31
cooling unit projection 31a
cooling unit opening 31b
tube 32
inlet tube 32a
outlet tube 32b
tube opening 32c
tube connection 33
tube clamp 34
end clamp 35
power supply unit 80
high current capacitor 81
heat sink 82
high voltage mains connector 83
contact pad layer 100
contact pad 102
power wire layer 103
power wire 104
data wire layer 105
data wire 106
transformer 107

We claim

1. In a combination of a housing including a cooling arrangement and a plurality of electric circuitry packages stacked in the housing, whereby:
    a) the cooling arrangement includes a plurality of cooling units interdigitated with the packages into a stack in which a cooling unit is provided above and another below each package, and a cooling fluid is provided for cooling the plurality of packages by flowing through each individual cooling unit,
    b) each cooling unit is connected to a cooling fluid source system via at least one inlet opening and at least one outlet opening for allowing the cooling fluid to flow through the unit,
    c) at least the package facing walls of each cooling unit are made of a flexible material,
    the improvement wherein:
    d) each cooling unit includes a cooling unit frame providing rigid walls perpendicular to the package facing walls of the cooling unit,
    e) each cooling unit is arranged slightly movable in the vertical direction within the housing,
    f) means of said cooling unit frames determine minimum distances between pairs of said packages in the stack,
    g) resilient connector assemblies connect each package in the stack and allow slight movement of the packages,
    h) each cooling unit includes a cooling wall made of a flexible material held in the cooling unit frame for making contact to a package, and
    i) resilient means for bringing the sandwiched stack of packages and cooling units under pressure for bringing each cooling unit into press contact with at least one package, and making the flexible walls of the cooling units adapt to surfaces of the packages.

2. A combination according to claim 1, wherein each cooling unit includes a cooling bag made of a flexible material fixed to the walls of the cooling unit frame.

3. A combination according to claim 1, wherein said resilient means includes a mechanical joint, which is mounted over the stack and which is tightenable.

4. A combination according to claim 1, wherein said resilient means includes the plurality of cooling units, whereby pressure is provided by the pressurized cooling fluid in the cooling units.

5. A combination according to claim 4, wherein each cooling unit is releasably connected to at least one cooling fluid inlet tube and at least one cooling fluid outlet tube, the tubes transporting the cooling fluid between the cooling units and a cooling fluid source, and in that the tubes have automatically closeable openings.

6. A combination according to claim 5, wherein several cooling units are connected to each of the inlet and outlet tubes.

7. A combination according to claim 6, wherein every second cooling unit is connected to the same inlet and outlet tubes.

8. A combination according to claim 7, wherein each cooling unit is provided with a plurality of inlets and outlets in order to evenly distribute the cooling fluid in the cooling unit.

9. A combination according to claim 1, wherein the cooling arrangement is provided with flow control means for controlling the cooling fluid distribution.

10. A combination according to claim 9, wherein the flow control means include walls provided with nozzles, which walls are situated inside a cooling unit.

11. A combination according to claim 9, wherein the flow control means include a flow throttle situated inside a cooling unit for controlling the flow in order to compensate for cooling fluid pressure drop.

12. A combination according to claim 9, wherein the flow control means include horizontal planes situated inside a cooling unit.

13. A combination according to claim 9, wherein the fluid is water.

14. A combination according to claim 9, wherein the fluid is air.

15. A combination according to claim 1, wherein the flexible material is polyamide laminated with polythene.

16. A housing with a cage assembly enclosing a plurality of electric circuitry packages, comprising:
   a) supporting units of said housing and resilient cooling units, each supporting a respective package mechanically, said supporting units comprising two end frames of said housing cage assembly connected to each other by means of a plurality of support rods, said resilient cooling units each comprising a package facing wall of resilient material,
   b) connection means electrically connecting the packages in the cage assembly as well as resiliently holding them, the packages being arranged mechanically loosely connected relative to the end frames of the housing,
   c) electrical power supply source means, which supplies the packages with electrical power and which are mounted to the end frames.

17. A housing according to claim 16, wherein the resilient supporting and cooling unit further includes a plurality of resilient units sandwiched with the packages into a stack, which is mounted in the cage assembly and in which a unit is provided both above and below each package.

18. A housing according to claim 17, wherein the said resilient units contains a cooling fluid, which cools the plurality of packages by flowing through each individual unit via at least one unit inlet and at least one unit outlet.

19. A housing according to claim 18, wherein the units are resilient in that at least the package facing walls of the units are made of a flexible material, which flexible walls form themselves to package surfaces due to the cooling fluid pressure.

20. A housing according to claim 18, wherein each supporting and cooling unit includes a cooling unit frame providing rigid walls perpendicular to the flexible package facing walls of the supporting and cooling unit, the frame being provided with a plurality of projections, each fitting in a corresponding slot provided in each support rod, the height of the projections deciding the minimum distance between the packages.

21. A housing according to claim 20, wherein the inlets and outlets of each supporting and cooling unit are releasably connected to at least one cooling fluid inlet tube and at least one cooling fluid outlet tube, respectively, the tubes being held in place by the end frames and transporting the cooling fluid between the cooling units and a cooling fluid source, and wherein the tubes have automatically closeable openings.

22. A housing according to claim 16, wherein each connector and wire assembly includes a plurality of resilient connector assemblies mounted to a plurality of backplanes, which are mounted to the support rods, each connector assembly contacting a plurality of wires for data communication and power supply to a plurality of contact points provided on each package.

23. A housing according to claim 22, wherein each connector assembly is resiliently mounted to a backplane by means of at least one shock spring situated between a backplane and the rest of the connector assembly, thereby allowing the connector assembly and the package contacted by the assembly to move as well as allowing package size variations.

24. A housing according to claim 22, wherein the plurality of wires are included in a flat cable, whereby at least one power wire is connected to the power supply means and at least one data wire is connected to at least one external terminal for external data communication and whereby at least one data wire is connected to the plurality of packages by means of the connector assemblies.

25. A housing according to claim 16, wherein eight support rods are used and wherein two support rods each are placed at each of the four corners of a package, with one support rod on each side of the corner in question.

26. A housing according to claim 16, wherein the power supply source means includes a plurality of parallel connected power units.

27. A housing according to claim 24, wherein each package is of a proper shape and of a sufficient size to accommodate a wafer sized VLSI-chip.

28. A housing according to claim 27, wherein each of the four sides of a package is provided with at least a hundred contact points.

29. A housing according to claim 16, wherein the resilient supporting and cooling units are interdigitated with the packages into a stack, which is mounted in the cage assembly.

30. A housing according to claim 29, wherein the resilient supporting and cooling units contain a cooling fluid, which cools the plurality of packages by flowing through each individual unit via at least one unit inlet and at least one unit outlet.

31. A housing according to claim 30, wherein at least one of the package facing walls of said supporting and cooling units is made of a flexible material, which flexible wall forms itself to a package surface due to the cooling fluid pressure.

32. A housing according to claim 30, wherein each supporting and cooling unit includes a rigid frame.

33. A housing according to claim 32, wherein the inlets and outlets of each supporting and cooling unit are releasably connected to at least one cooling fluid inlet tube and at least one cooling fluid outlet tube, respectively, the tubes being attached to the housing and transporting the cooling fluid between the cooling units and a cooling fluid source.

34. A housing according to claim 16, wherein the connection means includes a plurality of resilient connector assemblies mounted to at least one backplane, which is mounted to the support rods, each connector assembly being electrically connected to a package for data communication with and power supply to said package.

35. A housing according to claim 34, wherein each connector assembly is resiliently mounted to a backplane by means of at least one shock spring situated between a backplane and the rest of the connector assembly, thereby allowing the connector assembly and the package contacted by the assembly to move as well as allowing package size variations.

36. A housing according to claim 34, wherein the connection means comprises a plurality of wires, whereby at least one power wire is connected to the power supply means and at least one data wire is connected to at least one external terminal for external data communication and whereby at least one data wire is connected to the plurality of packages by means of the connector assemblies.

37. A housing according to claim 16, wherein eight support rods are used and wherein two support rods each are placed at each of the four corners of a package, with one support rod on each side of the corner in question.

38. A housing according to claim 16, wherein the power supply source means includes a plurality of power units.

39. A housing according to claim 36, wherein each package is of a proper shape and of a sufficient size to accommodate a wafer sized VLSI-chip.

40. A housing according to claim 39, wherein each of the four sides of a package is provided with at least a hundred contact points.

41. In a combination of a housing including a cooling arrangement and a plurality of electric circuitry packages stacked in the housing, whereby:
a) the cooling arrangement includes a plurality of cooling units interdigitated with the packages into a stack, and a cooling fluid is provided for cooling the plurality of packages by flowing through the cooling units,
b) each cooling unit is connected to a cooling fluid source system via at least one inlet opening and at least one outlet opening for allowing the cooling fluid to flow through the unit,
c) at least a package facing wall of a cooling unit is made of a flexible material,
the improvement wherein:
d) each cooling unit includes a cooling unit frame providing a rigid wall within the cooling unit,
e) each cooling unit is arranged slightly movable in the vertical direction within the housing,
f) means of said cooling unit frames determine minimum distances between pairs of said packages in the stack,
g) resilient connector assemblies connect the packages in the stack and allow slight movement of the packages,
h) each cooling unit includes a cooling wall made of a flexible material attached to the cooling unit frame for making contact to a package, and
i) resilient means for bringing the sandwiched stack of packages and cooling units under pressure for bringing each cooling unit into press contact with at least one package, and making the flexible walls of the cooling units adapt to surfaces of the packages.

42. A combination according to claim 41, wherein each cooling unit includes a cooling bag made of a flexible material fixed to the cooling unit frame.

43. A combination according to claim 41, wherein said resilient means includes a mechanical joint, which is mounted over the stack and which is tightenable.

44. A combination according to claim 41, wherein said resilient means includes the plurality of cooling units, whereby pressure is provided by the pressurized cooling fluid in the cooling units.

45. A combination according to claim 44, wherein each cooling unit is releasably connected to at least one cooling fluid inlet tube and at least one cooling fluid outlet tube, the tubes transporting the cooling fluid between the cooling units and a cooling fluid source, and in that the tubes have automatically closeable openings.

46. A combination according to claim 45, wherein several cooling units are connected to each of the inlet and outlet tubes.

47. A combination according to claim 46, wherein every second cooling unit is connected to the same inlet and outlet tubes.

48. A combination according to claim 47, wherein each cooling unit is provided with a plurality of inlets and outlets in order to evenly distribute the cooling fluid in the cooling unit.

49. A combination according to claim 41, wherein the cooling arrangement is provided with flow control means for controlling the cooling fluid distribution.

50. A combination according to claim 49, wherein the flow control means include walls provided with nozzles, which walls are situated inside a cooling unit.

51. A combination according to claim 49, wherein the flow control means include a flow throttle situated inside a cooling unit for controlling the flow in order to compensate for cooling fluid pressure drop.

52. A combination according to claim 49, wherein the flow control means include horizontal planes situated inside a cooling unit.

53. A combination according to claim 49, wherein the fluid is water.

54. A combination according to claim 49, wherein the fluid is air.

55. A combination according to claim 41, wherein the flexible material is polyamide laminated with polythene.

* * * * *